(12) United States Patent
Velasquez

(10) Patent No.: US 8,102,210 B2
(45) Date of Patent: Jan. 24, 2012

(54) LOW PHASE NOISE AMPLIFIER CIRCUIT

(75) Inventor: Carlos Velasquez, Neuchatel (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 12/754,860

(22) Filed: Apr. 6, 2010

(65) Prior Publication Data

US 2010/0253433 A1    Oct. 7, 2010

(30) Foreign Application Priority Data

Apr. 7, 2009 (EP) ..................................... 09157505

(51) Int. Cl.
*H03F 3/45* (2006.01)
(52) U.S. Cl. ...................................................... 330/257
(58) Field of Classification Search ........... 330/252–261
See application file for complete search history.

(56) References Cited

U.S. PATENT DOCUMENTS

| 5,783,934 | A | 7/1998 | Tran | |
|---|---|---|---|---|
| 7,068,077 | B1 | 6/2006 | Reinschmidt | |
| 7,688,140 | B2 * | 3/2010 | Yuasa | 330/253 |
| 2004/0251882 | A1 | 12/2004 | Mueller et al. | |
| 2004/0257119 | A1 | 12/2004 | Watanabe et al. | |
| 2007/0252621 | A1 | 11/2007 | Forbes | |

FOREIGN PATENT DOCUMENTS

| CH | 689088 A5 | 9/1998 |
|---|---|---|
| EP | 0987763 A1 | 3/2000 |

* cited by examiner

*Primary Examiner* — Hieu Nguyen
(74) *Attorney, Agent, or Firm* — Sughrue Mion, PLLC

(57) ABSTRACT

The amplifier circuit (1) includes a differential pair of PMOS transistors at input (P3, P4), whose source receives a current from a current source (3). The gate of the first transistor (P3) of the pair defines a non-inverting input ($X_{OUT}$) and the gate of the second transistor (P4) of the pair defines an inverting input ($X_{IN}$). A drain of the first transistor (P3) of the differential pair is connected to a diode connected NMOS transistor (N2) of a first current mirror (N1, N2), and a drain of the second transistor (P4) of the differential pair is connected to a diode connected NMOS transistor (N3) of a second current mirror (N3, N4). A diode connected PMOS transistor (P2) of a third current mirror is connected to the drain of a second NMOS transistor (N4) of the second current mirror, while a drain of a second PMOS transistor (P1) of the third current mirror is connected to the drain of a second NMOS transistor (N1) of the first current mirror to define a first output (OUT1), which is inverted by a reverser (N5, P7) to supply an inverted output signal (OUT) capable of varying rail to rail. A first complementary NMOS transistor (N6) is connected in the form of a reverser with the first PMOS transistor (P3) of the differential pair. A second complementary NMOS transistor (N7) is connected in the form of a reverser with the second MOS transistor (P4) of the differential pair.

9 Claims, 3 Drawing Sheets

US 8,102,210 B2

LOW PHASE NOISE AMPLIFIER CIRCUIT

This application claims priority from European Patent Application No. 09157505.0 filed Apr. 7, 2009, the entire disclosure of which is incorporated herein by reference.

FIELD OF THE INVENTION

The invention concerns a low phase noise amplifier circuit, particularly for supplying at least one clock or time base signal. This amplifier circuit, which may be an operational transconductance amplifier circuit, includes a differential pair of MOS or bipolar transistors at input, first and second current mirrors connected to the transistors of the differential pair, and a third current mirror, connected to the first and second current mirrors between two terminals of a supply voltage source. A connection node between the first and third current mirrors supplies an output signal, the level of which can extend over the entire supply voltage range.

The amplifier circuit of this invention can be deemed a buffer circuit. This type of buffer circuit is an intermediate amplifier circuit arranged, for example, between a quartz oscillator that delivers one or two oscillating signals in phase opposition, and a frequency conversion or data processing unit. This intermediate circuit converts low amplitude oscillating signals, which may be sinusoidal, into at least one output pulse signal. The output pulse signal extends over the entire supply voltage range, and is defined as "rail-to-rail". The frequency conversion unit may include a frequency synthesiser or form part of a receiver or transmitter for radio-frequency signals, such as GPS or Bluetooth, and the data processing unit may be partly an analogue-digital converter or a DC-DC converter.

When this type of amplifier circuit is used in conjunction with a quartz oscillator to supply at least one clock or time base signal in an electronic instrument, significant jitter degradation or phase noise deterioration generally occurs. This can be detrimental to the proper working of the electronic instrument, and may require the use of high power consumption circuits to avoid phase noise degradation.

BACKGROUND OF THE INVENTION

A known operational transconductance amplifier circuit structure is shown in FIG. 1. This amplifier circuit 1 is capable of supplying a rail to rail output signal OUT1. An operational transconductance amplifier circuit of this type with an inverted structure is also disclosed in CH Patent No. 689,088 (FIG. 5) for use as active polarizing means in a quartz oscillator.

The amplifier circuit of FIG. 1 includes a differential pair of PMOS transistors P3 and P4, wherein the sources of both PMOS transistors are connected to a current source 2. The current source 2, which is connected to a high potential terminal $V_{DD}$ of the supply voltage source, supplies a constant current $I_0$ to the differential pair of PMOS transistors. The gate of the first PMOS input transistor P3 forms a non inverting input $X_{OUT}$, while the gate of the second PMOS input transistor P4 forms an inverting input $X_{IN}$ of amplifier circuit 1.

The drain of the first PMOS input transistor P3 is connected to a diode connected NMOS transistor N2 of a first current mirror connected to a low potential terminal of the supply voltage source, for example, to earth. The gate of diode connected NMOS transistor N2 is connected to the gate of an identical, second NMOS transistor N1 of the first current mirror, to mirror the current passing through NMOS transistor N2 in second NMOS transistor N1. The drain of the second PMOS input transistor P4 is connected to a diode connected NMOS transistor N3 of a second current mirror connected to a low potential terminal of the supply voltage source, for example, to earth. The gate of diode connected NMOS transistor N3 is connected to the gate of an identical, second NMOS transistor N4 of the second current mirror to mirror the current passing through NMOS transistor N3 in second NMOS transistor N4.

The drain of the second NMOS transistor N4 of the second current mirror is connected to a diode connected PMOS transistor P2 of a third current mirror, which is connected to a high potential terminal $V_{DD}$ of the supply voltage source. The gate of this diode connected PMOS transistor P2 is connected to the gate of a second PMOS transistor P1 of the third current mirror, to mirror the current passing through diode connected PMOS transistor P2 in identical, second PMOS transistor P1. Finally, the drain of the second PMOS transistor P1 of the third current mirror is connected to the drain of the second NMOS transistor N1 of the first current mirror to define an output node for supplying an output signal OUT1.

When the voltage applied at inverting input $X_{IN}$ of the second PMOS transistor P4 of the differential pair is lower than the voltage applied at the non-inverting input $X_{OUT}$ of the first PMOS transistor P3 of the differential pair, the current $I_0$ from current source 2 passes through the second and third current mirrors. Consequently, the level of output signal OUT1 is close to supply voltage $V_{DD}$. Conversely, when the voltage applied at the non-inverting input $X_{OUT}$ of the first PMOS transistor P3 is lower than the voltage applied to the inverting input $X_{IN}$ of the second PMOS transistor P4, the current from current source 2 passes through the first current mirror. In these conditions, the level of output signal OUT1 is close to earth. However, at the conduction threshold of each PMOS transistor P3 and P4 of the differential pair, when the voltage level across each input $X_{IN}$ and $X_{OUT}$ is close, there is generally significant phase noise degradation. This phase noise is degraded, in particular, at the moment of transition of conduction between the two PMOS transistors of the differential pair with two oscillating, sinusoidal signals in phase opposition applied respectively across inverting input $X_{IN}$ and non-inverting input $X_{OUT}$.

The current in each current mirror, which is connected to the respective PMOS transistor of the differential pair, is generally not cut off quickly during transition of conduction between the PMOS transistors of the differential pair. A non-zero current remains in the current mirror, which should normally be in a non-conductive state, which decreases the amplifier gain and allows the noise generated in the transistors or in an external circuit, such as, for example, the supply source, to vary the moment of transition randomly. This results in signal phase noise degradation. This therefore constitutes a drawback of this amplifier circuit when it is used, for example, in a frequency synthesiser, radio-frequency signal receiver, analogue-digital converter or DC-DC converter.

Reference can be made to U.S. Pat. No. 6,806,744 for a simplified embodiment of an operational transconductance amplifier (OTA). The amplifier circuit of this Patent has only one differential pair of PMOS transistors, connected to a current source, which is connected to a high potential terminal of a supply voltage source, and also to a single NMOS current mirror, which is connected to earth. A connection node between a NMOS transistor of the mirror and one of the PMOS transistors of the differential pair supplies the amplifier circuit output signal. However, with this type of structure, the output signal cannot extend rail to rail, as in the present invention. Moreover, there is no provision for avoiding phase noise degradation, which constitutes another drawback.

SUMMARY OF THE INVENTION

It is thus an object of the invention to overcome the drawbacks of the prior art by providing a low noise amplifier circuit that is easy to make and ensures conversion of oscillating input signals into at least one rail to rail output pulse signal.

The invention therefore concerns an amplifier circuit of the aforecited type, which is characterized in that it includes a first complementary transistor, with a second type of conductivity, connected in parallel with the diode connected transistor of the first current mirror and connected in the form of a reverser with the first transistor of the differential pair, wherein the gate or base of the first complementary transistor is connected to the gate or base of the first transistor of the differential pair, and in that it includes a second complementary transistor, with a second type of conductivity, connected in parallel with the diode connected transistor of the second current mirror and connected in the form of a reverser with the second transistor of the differential pair, wherein the gate or base of the second complementary transistor is connected to the gate or base of the second transistor of the differential pair.

One advantage of the amplifier circuit according to the invention is that it slightly degrades phase noise to convert oscillating signals at the amplifier input to at least one rail to rail output signal. During transition of conduction between the transistors of the differential pair, particular MOS type transistors, the gate voltage of the first or second current mirrors decreases actively and more rapidly, because of the complementary transistors, which also ensure significant additional gain. This reduces the time during which phase noise can be generated. Consequently, the current in each current mirror, which passes into a non-conductive state, decreases rapidly.

The oscillating signals in phase opposition, for example, sinusoidal signals, may come from a quartz oscillator. The amplifier circuit output signal may thus constitute a clock signal for clocking the operations of an electronic instrument, such as a frequency synthesiser, GPS or Bluetooth radio-frequency signal receiver, analogue-digital converter or DC/DC converter.

Advantageously, the transistors can be MOS type transistors. Thus, with the corresponding MOS transistors of the differential pair, the complementary MOS transistors each form a pair of reversers, to define pseudo-differential inputs of the amplifier circuit. This also provides a good duty cycle, because of the symmetry of the pseudo-differential inputs, for converting the oscillating signals in phase opposition.

Advantageously, a fourth current mirror includes a diode connected transistor with a first type of conductivity, which is directly connected to the current source between two terminals of a supply voltage source. This diode connected transistor mirrors the current passing therethrough in a second transistor of the fourth mirror. The current of this second transistor is supplied to the sources or emitters of the differential pair transistors, which provides a good power supply rejection ratio (PSRR). The transistors are preferably MOS transistors.

Advantageously the differential pair of MOS transistors with a first type of conductivity comprises PMOS transistors. The first and second current mirrors are NMOS transistors with a second type of conductivity. The third and fourth current mirrors are PMOS transistors. Finally, the two complementary transistors are NMOS transistors.

Advantageously, a reverser is provided at the amplifier circuit output for supplying an inverted output signal. This reverser converts the high impedance connection node of the drains or collectors of the second transistors of the first and third current mirrors into a low impedance output signal.

Advantageously, the MOS transistors of the amplifier circuit are configured to receive oscillating signals in phase opposition at input, which may be at a higher frequency than 10 MHz, for example, 16 MHz, and to supply an inverted amplified output signal, which can be used as a clock or timing signal for operations in an electronic instrument. The measured and generated phase noise which is shifted from the oscillating input signal frequency can be more than 10 dB less than that of an amplifier circuit structure of the prior art.

BRIEF DESCRIPTION OF THE DRAWINGS

The objects, advantages and features of the low noise amplifier circuit will appear more clearly from the following description, based on non-limiting embodiments, and illustrated by the drawings, in which.

DETAILED DESCRIPTION OF THE PREFERRED EMBODIMENTS

In the following description, those elements of the amplifier circuit that are well known to those skilled in this technical field will be related only in a simplified manner, particularly as regards how each transistor of the amplifier circuit is made. The amplifier circuit of the present invention is mainly used for supplying at least one clock or time base signal in electronic instruments, on the basis of oscillating signals in phase opposition from a quartz oscillator. The transistors described below are preferably MOS transistors, although one could also envisage making the amplifier circuit with bipolar transistors or a combination of MOS and bipolar transistors. In this regard, it is noted that each PMOS transistor described below defines a MOS transistor with a first type of conductivity, whereas each NMOS transistor defines a MOS transistor with a second type of conductivity, although the opposite could also be envisaged.

Figure 1:
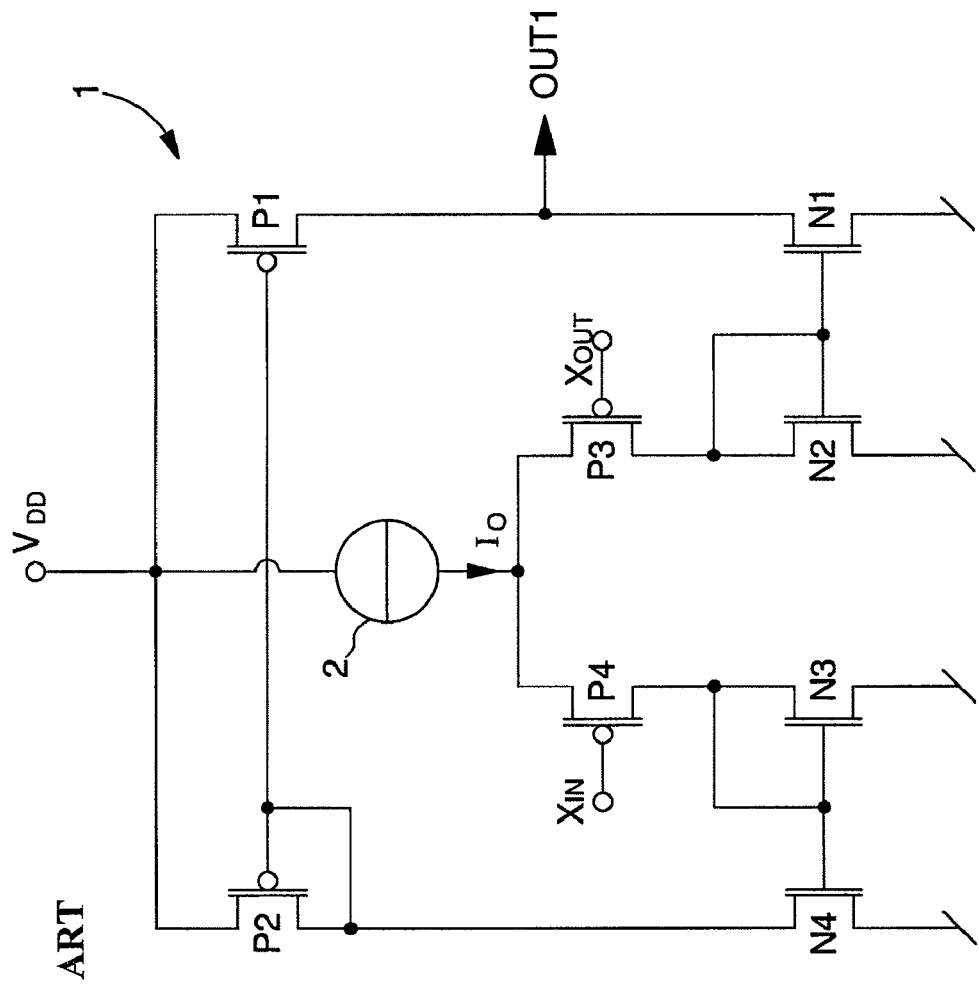
FIG. 1, already cited, shows an embodiment of an amplifier circuit according to the prior art.
Figure 2:
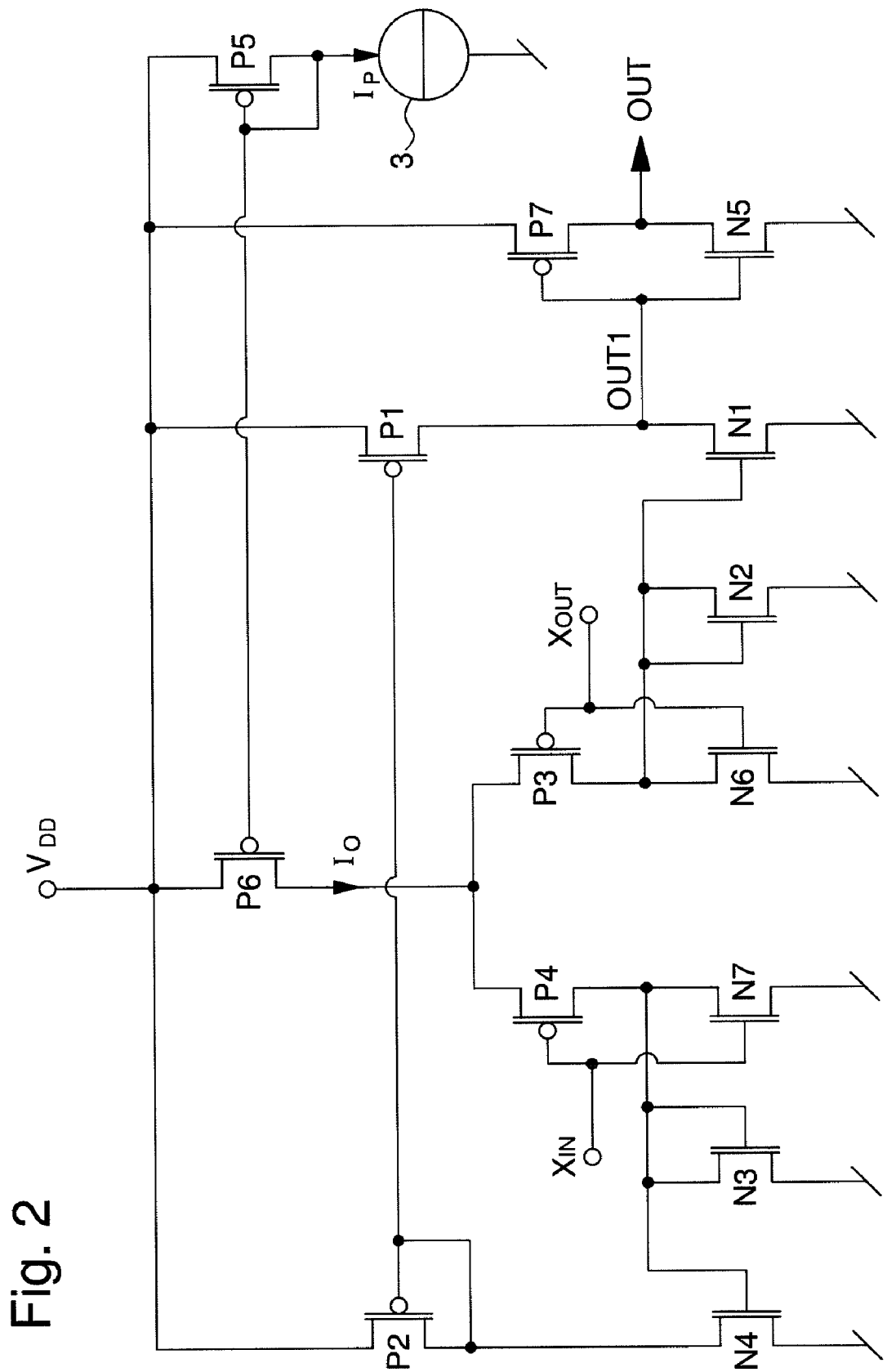
FIG. 2 shows a first embodiment of an amplifier circuit according to the invention.

FIG. 2 shows a first embodiment of a low noise amplifier circuit 1. This circuit is an operational transconductance amplifier circuit (OTA). The amplifier circuit of this invention is mainly based on the structure of the amplifier circuit described above and shown in FIG. 1.

Amplifier circuit 1 thus includes, firstly, a differential pair of PMOS transistors P3 and P4. The sources of the PMOS transistors of the differential pair are connected to receive a constant current $I_0$ generated via a current source 3. The gate of a first PMOS transistor P3 of the differential pair defines a non-inverting input $X_{OUT}$, whereas the gate of a second PMOS transistor P4 of said pair defines an inverting input $X_{IN}$. One drain of the first PMOS transistor P3 of the differential pair is directly connected to a first diode connected NMOS transistor N2 of a first current mirror. The source of the first diode connected NMOS transistor N2 is directly connected to a low potential terminal of a supply voltage source $V_{DD}$, particularly to earth. One drain of the second PMOS transistor P4 of the differential pair is directly connected to a first diode connected NMOS transistor N3 of a second current mirror. The source of the first diode connected NMOS transistor N3 is directly connected to earth.

A first diode connected PMOS transistor P2 of a third current mirror is connected to the drain of a second NMOS transistor N4 of the second current mirror, whose gate is connected to the gate and drain of the first diode connected NMOS transistor N3. The source of the second NMOS transistor N4 is directly connected to earth, whereas the source of the first diode connected PMOS transistor P2 of the third current mirror is directly connected to the high potential terminal $V_{DD}$ of the supply voltage source. The current passing through the first diode connected NMOS transistor N3 can thus be mirrored in the second NMOS transistor N4 of the second current mirror so as to pass through the first PMOS transistor P2 of the third current mirror. The third current mirror also includes a second PMOS transistor P1, whose gate is connected to the gate and drain of the first diode connected PMOS transistor P2, and whose source is connected to the high potential terminal $V_{DD}$. The current passing through the first diode connected PMOS transistor P2 can thus be mirrored in the second PMOS transistor P1.

The drain of the second PMOS transistor P1 of the third current mirror is connected to the drain of a second NMOS transistor N1 of the first current mirror to define a first output OUT1 of the amplifier circuit. The gate of the second NMOS transistor N1 of the first current mirror is connected to the gate and drain of the first diode connected NMOS transistor N2, whereas the source of the second NMOS transistor N1 is directly connected to earth. Thus, the third current mirror is connected in series with the first current mirror and with the second current mirror between the two terminals of a supply voltage source $V_{DD}$. This allows the first output signal OUT1 to vary rail to rail.

Current source 3, which is connected to earth, supplies a polarising current $I_p$ of a determined value, for example around several micro amperes. Current source 3 is connected in series to a first diode connected PMOS transistor P5 of a fourth current mirror. The source of the first diode connected PMOS transistor P5 is connected to the high potential terminal $V_{DD}$ of a supply voltage source. The fourth current mirror also includes a second PMOS transistor P6, whose gate is connected to the gate and drain of the first diode connected PMOS transistor P5, and whose source is connected to the high potential terminal $V_{DD}$. The current $I_p$ passing through the first diode connected PMOS transistor P5 can thus be mirrored in the second PMOS transistor P6 so as to supply constant current $I_0$ of determined value to the sources of the PMOS transistors of the differential pair. A good power supply rejection ratio can be obtained because of the fourth current mirror with second PMOS transistor P6, which supplies constant current $I_0$. This second PMOS transistor P6 thus allows less coupling with the power supply rail, which has the effect of reducing electric power noise.

In order to degrade the amplifier circuit phase noise very slightly, which the invention seeks to achieve, said amplifier circuit further includes two complementary NMOS transistors N6 and N7. A first complementary NMOS transistor N6 is connected in parallel with the first diode connected NMOS transistor N2 of the first current mirror. The source of this first complementary NMOS transistor N6 is thus connected to earth and the drain thereof is connected to the gate and drain of the first NMOS transistor N2, and to the drain of the first PMOS transistor P3 of the differential pair. The gate of the first complementary NMOS transistor N6 is connected to the gate of the first PMOS transistor P3 of the pair, which forms a non-inverting input $X_{OUT}$ of amplifier circuit 1. Thus the assembly of this first complementary NMOS transistor N6 with the first PMOS transistor P3 of the differential pair forms a reverser circuit.

A second complementary NMOS transistor N7 is connected in parallel with the first diode connected NMOS transistor N3 of the second current mirror. The source of this second complementary NMOS transistor N7 is thus connected to earth and the drain thereof is connected to the gate and drain of the first NMOS transistor N3, and to the drain of the second PMOS transistor P4 of the differential pair. The gate of the second complementary NMOS transistor N7 is connected to the gate of the second PMOS transistor P4 of the pair, which forms an inverting input $X_{IN}$ of amplifier circuit 1. Thus, the assembly of this second complementary NMOS transistor N7 with the second PMOS transistor P4 of the differential pair constitutes another reverser circuit.

Because of the complementary NMOS transistors N6 and N7, this device prevents significant degradation of the amplifier circuit phase noise, or any significant jitter. The oscillating signals in phase opposition, which are supplied to inputs $X_{IN}$ and $X_{OUT}$ of the amplifier circuit, can thus be converted to obtain at least one output pulse signal OUT1 capable of extending rail to rail. A good duty cycle ratio can also be obtained because of the symmetry of the inputs of the pair of reversers. During transition of conduction between the PMOS transistors P3 and P4 of the differential pair, the gate voltage of the first or second current mirrors decreases actively and more rapidly. Thus, the current in each current mirror, which has to pass into a non-conductive state, decreases rapidly, which prevents any significant phase noise being generated. These complementary NMOS transistors N6 and N7 also ensure significant additional gain for amplifier circuit 1.

Amplifier circuit 1 can be powered by a continuous supply voltage source (not shown), which may be a battery. The value of high potential $V_{DD}$ of this supply voltage source can be selected to be between 1.5 and 2 V for example.

To make the MOS transistors of amplifier circuit 1 in a P silicon substrate, the well of PMOS transistors P3 and P4 of the differential pair may, for example, be connected to the source terminal. This further increases the amplifier circuit gain compared to when the well is directly connected to the high potential terminal of the supply voltage $V_{DD}$. However, the NMOS transistor well is directly connected to earth.

To show more clearly the advantage of amplifier circuit 1 with complementary NMOS transistors N6 and N7, reference can be made to the table below. This table compares phase noise in dBc per Hertz (ratio between noise power in a 1 Hz bandwidth and carrier signal power expressed in decibels) for an amplifier circuit of the prior art, as shown in FIG. 1, and an amplifier circuit according to the invention, shown in FIG. 2. The frequency of the oscillating signals from a quartz oscillator is higher than 10 MHz, and preferably equal to 16 MHz, and phase noise is compared to various frequencies shifted relative to the central frequency of the oscillating signals within a bandwidth of 1 Hz to each shift frequency. It can thus be observed that the phase noise of the amplifier circuit according to the present invention is generally more than 10 dB lower than the noise of the prior art amplifier circuit. This gives amplifier circuit 1 of the present invention a very clear advantage for integration into an electronic instrument to provide a clock output signal for timing operations of said instrument.

| Shift frequency relative | Phase noise | |
| --- | --- | --- |
| to 16 MHz | Prior art amplifier | Amplifier of the invention |
| 100 Hz | −100 dBc/Hz | −104 dBc/Hz |
| 1 kHz | −108 dBc/Hz | −119 dBc/Hz |
| 10 kHz | −110 dBc/Hz | −134 dBc/Hz |
| 100 kHz | −115 dBc/Hz | −139 dBc/Hz |

In addition to complementary NMOS transistors N6 and N7, the amplifier circuit of the present invention includes a reverser at the output of the circuit for supplying an inverted output signal OUT. This reverser is formed of a NMOS transistor N5 series connected with a PMOS transistor P7 between the two terminals of the supply voltage $V_{DD}$. The gates of the two MOS transistors of the reverser are connected to the drains of the second NMOS and PMOS transistors N1 and P1 of the first and third current mirrors, and the drains of the two MOS transistors of the reverser supply the inverted output signal OUT. This reverser converts the high impedance connection node OUT1 of the drains of the second MOS transistors of the first and third current mirrors into a low impedance output signal.

Each MOS transistor of each current mirror can be of identical size. However, in some current mirrors, one could also envisage making a first MOS transistor of different size from the second MOS transistor so as to mirror a current, which is a function of the size of the MOS transistors of the current mirror. Generally the PMOS transistors of the differential pair are of relatively large size compared to the other MOS transistors of amplifier circuit 1. However, it is also sought to make a low power amplifier circuit, which nonetheless operates at frequencies higher than 10 MHz.

Figure 3:
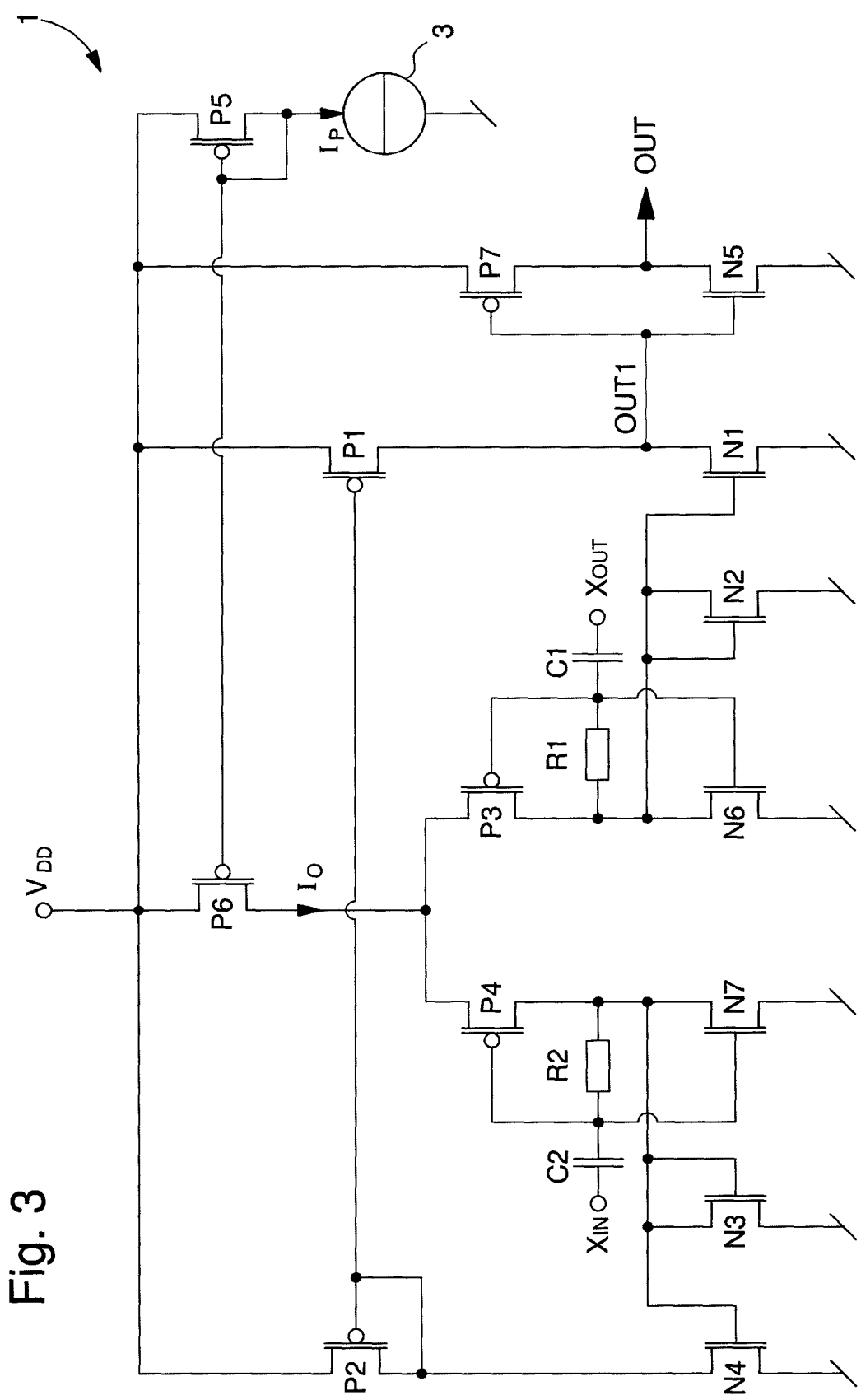
FIG. 3 shows a second embodiment of an amplifier circuit according to the invention.

FIG. 3 shows a second embodiment of a low noise amplifier circuit 1. As this second embodiment of the amplifier circuit is very similar to the first embodiment, for the sake of simplification, those elements that bear the same reference numerals as those shown in FIG. 2 will not be described.

The only difference in this second embodiment of amplifier circuit 1 is the addition of capacitors C1 and C2 and resistors R1 and R2 at the amplifier circuit input. The DC voltage level at the amplifier circuit input must not be too high, to ensure that complementary NMOS transistors N6 and N7 operate, if possible, in low inversion, to obtain the maximum gain. Generally, if the amplifier circuit input signals are oscillating signals from a Pierce quartz oscillator, the DC level is close to a threshold NMOS voltage and complementary NMOS transistors N6 and N7 work in low inversion. Consequently, the first embodiment of FIG. 2 is sufficient. However, in other applications, it is possible that the account has to be taken of a significant DC voltage level, which requires the addition of capacitors C1 and C2 and resistors R1 and R2.

A first resistor R1 is thus arranged between the gates and drains of the first PMOS transistor P3 of the differential pair and first complementary NMOS transistor N6. A first capacitor C1 is arranged at the non-inverting input with a first electrode connected to the gates of the first PMOS transistor P3 and the first complementary NMOS transistor N6, and a second electrode $X_{OUT}$ for receiving a first oscillating signal at the first non-inverting input. A second resistor R2 is arranged between the gates and drains of the second PMOS transistor P4 of the differential pair and the second complementary NMOS transistor N7. A second capacitor C2 is arranged at the inverting input with a first electrode connected to the gates of the second PMOS transistor P4 and the second complementary NMOS transistor N7, and a second electrode $X_{IN}$ for receiving a second oscillating signal at the inverting input, which is in phase opposition to the first oscillating signal. The resistive value of each resistor R1 and R2 generally has to have a higher value than the input impedance of PMOS transistors P3 and P4. This resistive value can be chosen to be around 470 kOhms or 1 MOhm. The capacitive value of each capacitor C1 and C2 must, in theory, have a low impedance value relative to the input impedance of the differential pair. If the capacitive value at the gate of each PMOS transistor P3 and P4 is around 200 fF, the capacitive value of capacitors C1 and C2 can be around 2 pF. This means that the input signal voltage across the gates of the PMOS transistors of the differential pair is not decreased too much. These resistive and capacitive values are also determined as a function of the oscillating signal frequency, which may be around 16 MHz.

The amplifier circuit described above can advantageously be made in integrated form in a p-doped silicon substrate in 0.25 μm, 0.18 μm or other CMOS technology. This provides a low noise and low power amplifier circuit.

It should be noted that the embodiments presented in FIGS. 2 and 3 can also be made using bipolar transistors or a combination of bipolar and MOS (BiCMOS) transistors. For an embodiment with bipolar transistors, a current source can be connected in series with the transistors of the output reverser, if the supply voltage is too high. With an amplifier circuit made using bipolar transistors, the phase noise generated by said amplifier circuit is generally lower than that of the amplifier circuit made with MOS transistors. However, with bipolar transistors, the amplifier circuit can be a high electric power consumer.

From the description that has just been given, several variants of the low phase noise amplifier circuit can be devised by those skilled in the art without departing from the scope of the invention defined by the claims. The amplifier circuit can also be made with a differential pair of NMOS transistors, first and second current mirrors with PMOS transistors, third and fourth current mirrors with NMOS transistors and complementary PMOS transistors.

What is claimed is:

1. An amplifier circuit comprising:
   a differential pair of first type transistors at input,
      wherein a source or emitter of each transistor of the differential pair is connected to receive a current generated by a current source, a gate or base of a first transistor of the differential pair defines a non-inverting input and a gate or base of a second transistor of the differential pair defines an inverting input,
      wherein a drain or collector of the first transistor of the differential pair is connected to a first second-type diode-connected transistor of a first current mirror, and a drain or collector of the second transistor of the differential pair is connected to a first second-type diode-connected transistor of a second current mirror,
      wherein a first first-type diode-connected transistor of a third current mirror is connected to a drain or collector of a second second-type transistor, of the second current mirror, while a drain or collector of a second first-type transistor of the third current mirror is connected to a drain or collector of a second second-type transistor of the first current mirror to define an output of the amplifier circuit,
      wherein the third current mirror is connected in series with the first current mirror and with the second current mirror between two terminals of a supply voltage source to allow the output signal to operate rail to rail, wherein the amplifier circuit further comprises a first complementary second-type transistor, connected in parallel with the first second-type diode-connected transistor of the first current mirror and connected in the form of a reverser with the first transistor of the differential pair, wherein a gate or base of the first complementary second-type transistor is connected to the gate or base of the first transistor of the differential pair, and wherein the amplifier circuit further comprises a second second-type complementary transistor, connected in parallel with the first second-type diode-connected transistor of the second current mirror, and connected in the form of a reverser with the second transistor of the differential pair, wherein a gate or base of the second second-type complementary transistor is connected to the gate or base of the second transistor of the differential pair.

2. The amplifier circuit according to claim 1, further comprising:

a fourth current mirror, the fourth current mirror comprising a first-type diode-connected transistor of the fourth current mirror connected to the current source in series between the two terminals of the supply voltage source, and a second first-type transistor of the fourth current mirror, connected to the first-type diode-connected transistor of the fourth current mirror to mirror, in a certain proportion, the current of the current source and to supply the mirrored current to the sources or emitters of the transistors of the differential pair.

3. The amplifier circuit according to claim 1, wherein the first and second transistors of the differential pair are PMOS transistors, wherein the transistors of the first and second current mirrors are NMOS transistors, wherein sources of the transistors of the first and second current mirrors are connected to a low potential terminal of the supply voltage source, wherein the transistors of the third and fourth current mirrors are PMOS transistors, wherein source of the transistors of the third and fourth current mirrors are connected to a high potential terminal of the supply voltage source, and wherein the first and second complementary transistors are NMOS transistors.

4. The amplifier circuit according to claim 1, further comprising a reverser, which is formed of an NMOS transistor connected in series with a PMOS transistor between the two terminals of the supply voltage, wherein gates of the NMOS and PMOS transistors of the reverser are connected to the drains or collectors of the second transistors of the first and third current mirrors, and drains of the NMOS and PMOS transistors of the reverser supply an inverted output signal.

5. The amplifier circuit according to claim 1, further comprising a first resistor arranged between the gates and drains of the first transistor of the differential pair and the first complementary second-type transistor and a second resistor arranged between the gates and drains of the second transistor of the differential pair and the second second-type complementary transistor, to ensure that the first and second second-type complementary transistors operate in low inversion, wherein the first and second transistors of the differential pair are MOS transistors.

6. The amplifier circuit according to claim 5, further comprising a first capacitor, whose first electrode is connected to the gate of the first transistor of the differential pair and a second electrode is provided for receiving a first oscillating signal, and a second capacitor, whose first electrode is connected to the gate of the second transistor of the differential pair, and a second electrode is provided for receiving a second oscillating signal in phase opposition to the first oscillating signal, wherein the first and second transistors of the differential pair are MOS transistors.

7. The amplifier circuit according to claim 1, wherein the transistors of the amplifier circuit are configured to allow conversion of two oscillating, sinusoidal signals in phase opposition at a higher frequency than 10 MHz, respectively supplied to the inverting input and to the non-inverting input of the amplifier circuit, into at least one rail to rail output pulse signal wherein the transistors of the amplifier circuit comprise MOS transistors.

8. The amplifier circuit according to claim 1, wherein the transistors of the amplifier circuit are configured to reduce phase noise by at least 10 dB compared to the noise generated by a structure without any complementary transistors for an oscillating signal frequency at the circuit input of around 16 MHz wherein the transistors and the complementary transistors of the amplifier circuit comprise MOS transistors.

9. The amplifier circuit according to claim 1, wherein the transistors of the differential pair comprise PMOS transistors, wherein wells of the transistors of the differential pair are electrically connected to the source, to increase the amplifier circuit gain.

* * * * *